United States Patent [19]

Muto et al.

[11] Patent Number: 5,801,594
[45] Date of Patent: Sep. 1, 1998

[54] QUARTZ OSCILLATOR DEVICE AND ITS ADJUSTING METHOD

[75] Inventors: Masaki Muto, Katano; Yoshihisa Mochida, Ikoma; Ryuji Mizukoshi, Shimoshakujii-machi; Chikao Maeda, Kunitachi, all of Japan

[73] Assignee: Matsushita Electric Industrial Co., Ltd., Osaka, Japan

[21] Appl. No.: 750,827

[22] PCT Filed: Jun. 28, 1995

[86] PCT No.: PCT/JP95/01285

§ 371 Date: Mar. 7, 1997

§ 102(e) Date: Mar. 7, 1997

[87] PCT Pub. No.: WO96/32775

PCT Pub. Date: Oct. 17, 1996

[30] Foreign Application Priority Data

Apr. 14, 1995 [JP] Japan ................... 7-089331

[51] Int. Cl.[6] ............... H03B 5/32; H03B 1/00; H03L 1/00
[52] U.S. Cl. .............. 331/158; 331/176; 331/177 V
[58] Field of Search .................. 331/158, 175, 331/176, 177 R, 177 V

[56] References Cited

U.S. PATENT DOCUMENTS

| | | | |
|---|---|---|---|
| 3,719,838 | 3/1973 | Peduto et al. | 331/176 |
| 5,081,431 | 1/1992 | Kubo et al. | 331/176 |
| 5,126,699 | 6/1992 | Kabler | 331/176 |
| 5,473,289 | 12/1995 | Ishizaki et al. | 331/176 |
| 5,548,252 | 8/1996 | Watanabe et al. | 331/176 |

FOREIGN PATENT DOCUMENTS

| | | |
|---|---|---|
| 57-172426 | 10/1982 | Japan . |
| 59-33906 | 2/1984 | Japan . |
| 59-109975 | 6/1984 | Japan . |
| 61-216026 | 9/1986 | Japan . |
| 62-38605 | 2/1987 | Japan . |
| 1-265708 | 10/1989 | Japan . |

OTHER PUBLICATIONS

International Search Report.
Translation of International Search Report.

*Primary Examiner*—David C. Nelms
*Assistant Examiner*—Trong Phan
*Attorney, Agent, or Firm*—Ratner & Prestia

[57] ABSTRACT

A crystal oscillation apparatus and a method of adjusting the same, comprising a crystal oscillating circuit, a frequency adjusting element coupled with the crystal oscillating circuit, and a control circuit for controlling voltage to be applied to the frequency adjusting element. The control circuit comprises a temperature sensor, a temperature detecting section coupled with the temperature sensor, a memory device coupled with the temperature detecting section, an amplifier to which the memory device and the temperature sensor are coupled, a first D/A converter between the memory device and temperature detection section, and a second D/A converter between the memory device and amplifier. The memory device has no more than 8 control voltage setting groups. Each of the control voltage setting groups has temperature detection data, amplitude setting data and offset voltage data.

20 Claims, 10 Drawing Sheets

| GRADUATION NO. 1 TEMPERATURE DETECTION DATA |
| GRADUATION NO. 1 GRADUATION SETTING DATA |
| GRADUATION NO. 1 GRADUATION SETTING DATA |
| GRADUATION NO. 1 OFFSET VOLTAGE DATA |
| GRADUATION NO. 2 TEMPERATURE DETECTION DATA |
| GRADUATION NO. 2 GRADUATION SETTING DATA |
| GRADUATION NO. 2 GRADUATION SETTING DATA |
| GRADUATION NO. 2 OFFSET VOLTAGE DATA |
| ⋮ |
| GRADUATION NO. 8 TEMPERATURE DETECTION DATA |
| GRADUATION NO. 8 GRADUATION SETTING DATA |
| GRADUATION NO. 8 GRADUATION SETTING DATA |
| GRADUATION NO. 8 OFFSET VOLTAGE DATA |

QUARTZ OSCILLATOR DEVICE AND ITS ADJUSTING METHOD

TECHNICAL FIELD

The present invention relates to a crystal oscillation apparatus with built-in temperature compensation function, and a method of adjusting this crystal oscillation apparatus.

BACKGROUND OF THE INVENTION

The crystal oscillation apparatus comprises crystal oscillating circuit; the oscillation frequency of the crystal oscillating circuit significantly shifts along with the change in temperature.

In order to keep said frequency shift due to temperature variation small, a prior art crystal oscillating circuit as disclosed in Japan patent publication No.Heil-265708 controls the voltage to be applied to varactor diode, which is used as a frequency adjusting element of crystal oscillating circuit, by means of a control circuit.

Said prior art control circuit has following constitution; suppose the temperature compensation has to be performed for a range of 130° C. between −35° C. and 95° C., the 300° C. range is divided into zones of 4° C. and temperature compensation data for each of the 4° C. zones are put into respective memory devices.

In the prior art, data regarding the precise graduation, temperature bias point, polarity, rough graduation and fixed offset are necessary for each of said 4° C. zones in order to compensate the temperature shift; which data are divided into 32 control voltage setting groups of 4° C. zone and are stored in respective memory devices.

In the above described constitution, temperature is detected by a temperature sensor, one out of the data of control voltage setting groups corresponding to the temperature detected is selected and picked up out of the memory device, thereby the oscillation frequency of crystal oscillating circuit is stabilized against variation of the ambient temperature.

A problem with said prior art is that it needs memory device of large memory capacity; consequently, a large size semiconductor integrated circuits is needed to house the memory device and control circuits to control the large memory, such control circuits inevitably become complicated and consumes a large power.

Namely, in said prior art, the temperature compensation data are prepared for each of the 4° C. zones, which data are stored in the memory of control voltage setting groups for performing the temperature-compensation by 4° C. interval from −35° C. to 95° C.; which means the memory device should have a capacity large enough for momorizing as many as 32 control voltage setting groups, large and sophisticated control circuits are needed to control the large memory, as a result a semiconductor integrated circuits containing the memory and the control circuits inevitably becomes large sized.

Furthermore, control circuits to control the memory comprising 32 control voltage setting groups consume much power.

SUMMARY OF THE INVENTION

The present invention is to provide an apparatus with which a semiconductor integrated circuits comprising memories and control circuits can be made smaller, hence consuming smaller power.

In order to implement the objective, the invented apparatus comprises a crystal oscillating circuit, a frequency adjusting element electrically coupled with the crystal oscillating circuit, and a control circuit for controlling the voltage to be applied to the frequency adjusting element; said control circuit comprises a temperature sensor, a temperature detecting section electrically coupled with the temperature sensor, a memory device electrically coupled with the temperature detecting section, an amplifier to which the memory device and said temperature sensor are electrically coupled, a first D/A converter electrically intervening between said memory device and temperature detecting section, a second D/A converter electrically intervening between said memory device and amplifier; said memory device comprises actually-operative control voltage setting groups counting not more than 8 groups, each of the control voltage setting groups has in the memory a temperature detection data, amplitude setting data, and an offset voltage data.

Under the above described constitution, the memory contains not more than 8 units of actually-operative control voltage setting groups, each of which groups is comprised of temperature detection data, amplitude setting data and offset voltage data. Therefore, a memory device having smaller memory capacity is suffice, and a simpler control circuit can control the memory of not more than 8 actually-operative control voltage setting groups, as a result the size of semiconductor integrated circuits containing the memory and control circuit is reduced.

Furthermore, the smaller memory and the simpler control circuit can work on smaller power consumption.

BEST MODE FOR CARRYING OUT THE INVENTION

In the following, an embodiment of the present invention is described referring to attached drawings.

Figure 2:
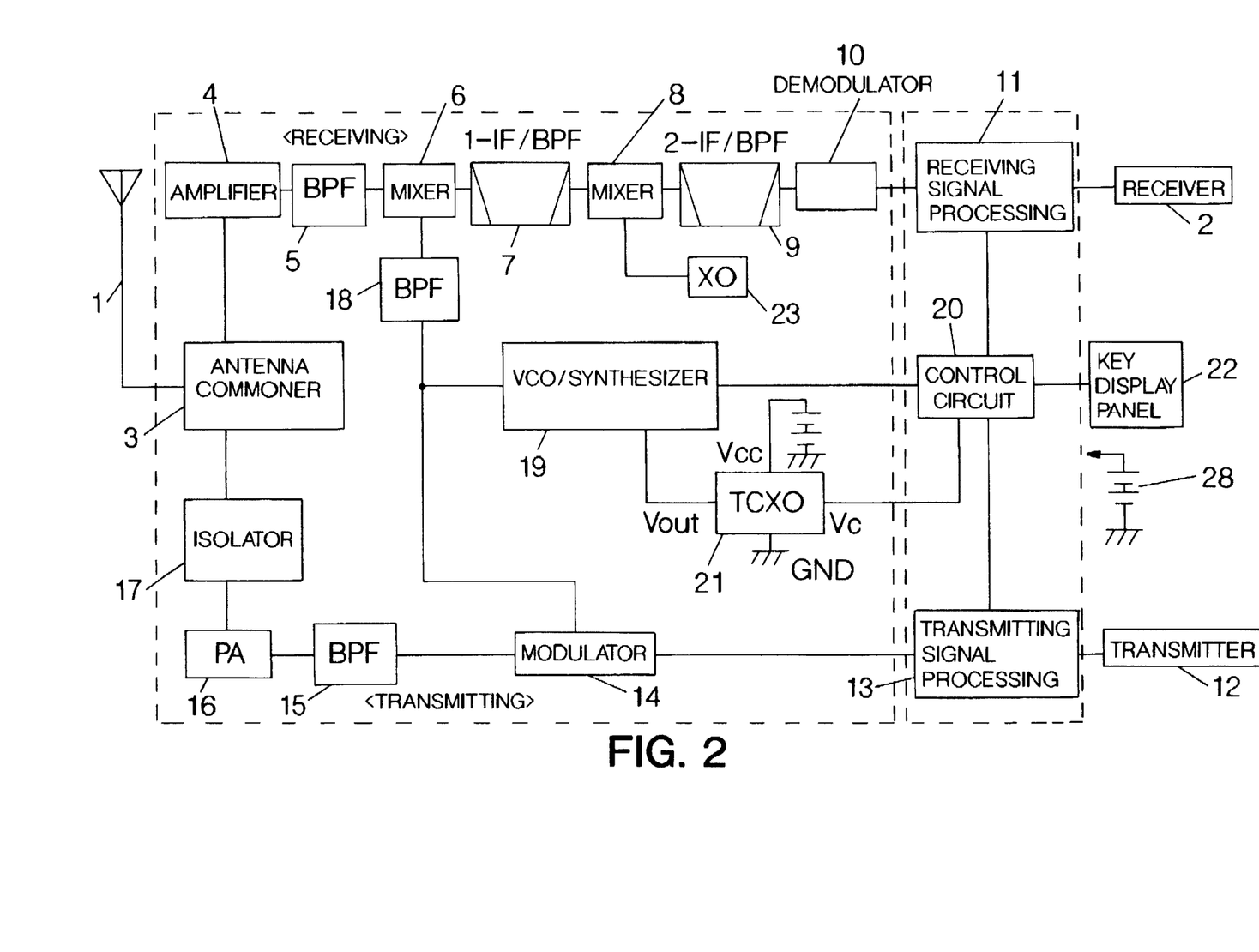
FIG. 2 is a block diagram of a mobile telephone using the crystal oscillation apparatus of FIG.1.

FIG. 2 is a block diagram of a mobile telephone; where numeral 1 denotes an antenna, provided between the antenna 1 and a receiver 2 are, from antenna 1, an antenna commoner 3, an amplifier 4, a band pass filter 5, a mixer 6, a band pass filter 7, a mixer 8, band pass filter 9, a demodulator 10, and a receiving signal processing circuit 11. Provided between a transmitter 12 and the antenna commoner 3 are, from transmitter 12, a transmitting signal processing circuit 13, a modulator 14, a band pass filter 15, a power amplifier 16, and an isolator 17. The mixer 6 is coupled with a VCO/synthesizer 19 via band pass filter 18, the VCO/synthesizer 19 is coupled also with the modulator 14. To the VCO/synthesizer 19, a control circuit 20 and the closed circuit of a temperature compensation type crystal oscillating circuit (hereinafter referred to as TCXO) 21 are coupled. The control circuit 20 is coupled with the receiving and transmitting signal processing circuits 11, 13 and a key/display panel 22. To the mixer 8, a crystal oscillating circuit 23 is coupled.

A signal generated at TCXO 21 is gradually doubled at VCO/synthesizer 19, which is supplied via band pass filter 18 to mixer 6 of receiving system, at the same time direct to modulator 14. A diagram of such constitution is already known.

Figure 1:
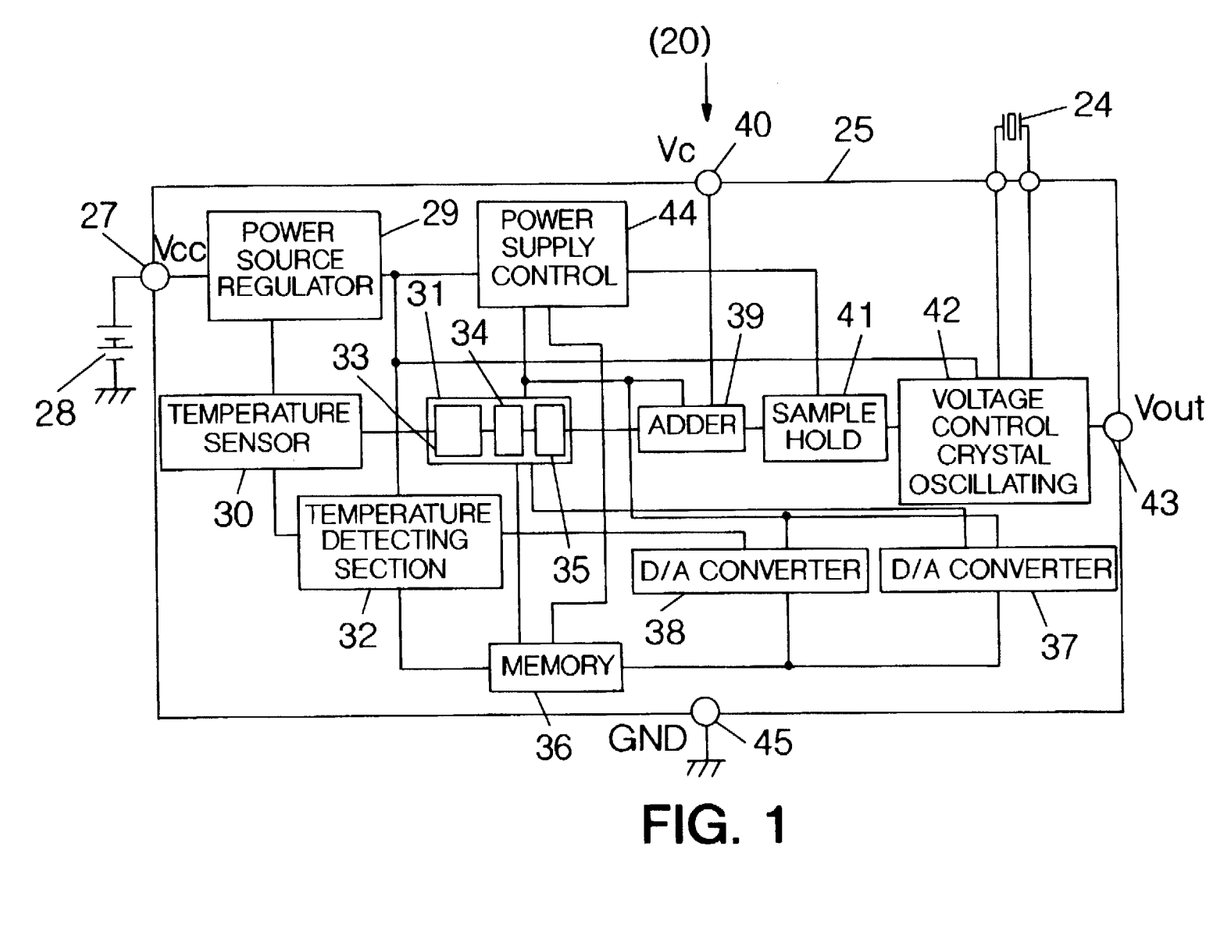
FIG. 1 is a block diagram of a crystal oscillation apparatus according to an embodiment of the present invention.
Figure 3:
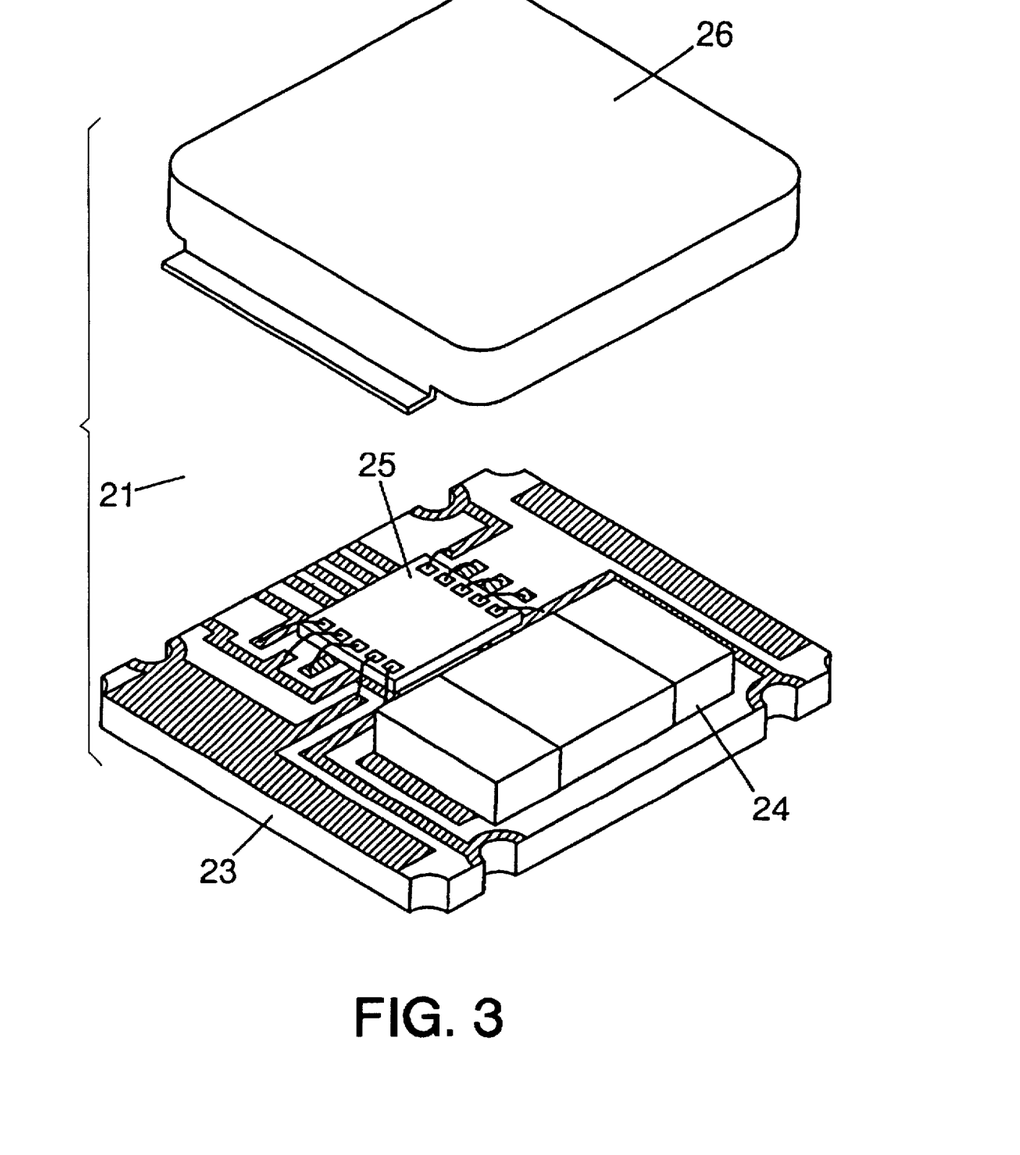
FIG. 3 is a perspective view of a TCXO exploded used in the crystal oscillation apparatus of FIG. 1.

The constitution of TCXO 21 in the present embodiment is shown in FIG. 1 and FIG. 3. In FIG. 3, numeral 23 denotes a base board. On top of which base board 23, a crystal oscillator 24 and a semiconductor integrated circuits (hereinafter referred to as IC) 25 are mounted, and are covered and hermetically sealed with a metal case 26 covering the base board 23. IC 25 is as shown in FIG. 1 coupled at its Vcc terminal 27 with a battery 28 of mobile telephone shown in FIG. 2. The Vcc terminal 27 is coupled also with a power source regulator 29 for stabilizing the power supply.

The power source regulator 29 is for supplying stable electricity to each of the parts shown in FIG. 1. A temperature sensor 30 built within the IC 25 is coupled with an amplifier 31 and a temperature detecting section 32, and supplies the detected temperature signal to the both. The temperature sensor 30 is comprised of a semiconductor diode, whose resistance value linearly decreases along with the temperature going from the low to high, thereby the output voltage shows a linear decrease.

The amplifier 31 is comprised of a polarity reversing circuit 33, a variable attenuator 34, and an amplifying circuit 35. The polarity reversing circuit 33 is coupled with temperature sensor 30. The variable attenuator 34 is coupled with polarity reversing circuit 33, memory 36, and second D/A converter 37.

The amplifying circuit 35 is coupled with memory 36 and variable attenuator 34. Between memory 36 and temperature detecting circuit 32, the first D/A converter 38 is intervening.

An adder 39 is coupled with the amplifying circuit 35 of amplifier 31. The adder 39 is coupled via Vc terminal 40 with the control circuit 20 of mobile telephone shown in FIG. 2.

The output of adder 39 is supplied via sample hold circuit 41 to voltage control crystal oscillating circuit 42, the output of voltage control crystal oscillating circuit 42 is supplied via Vout terminal 43 to VCO/synthesizer 19 shown in FIG. 2.

In FIG. 1, numeral 44 denotes a power supply control section for intermittently operating the TCXO 21, which will be described later in detail, and 45 is a grounding terminal.

The operation of TCXO 21 shown in FIG. 1 will be described later in detail. For the sake of easier explanation, the outline of operation as a whole is described here.

There are as many as 8 groups maximum of temperature detection data, amplification setting data and offset voltage data memorized in memory 36 as the control voltage setting group.

As soon as a temperature detected by temperature sensor 30 is supplied to temperature detecting section 32 as a first signal, a temperature detection data among the 8 control voltage setting groups stored in memory 36 is supplied via first D/A converter 38 to temperature detecting section 32 one after another as a second signal; and the first and the second signals are compared there.

Based on the result of comparison, a decision as to which amplification setting data and offset voltage data of control voltage setting group among the 8 groups stored in memory 36 are to be supplied to amplifier 31 and second D/A converter 37 is made, and executed.

The execution brings about an operation for suppressing the shift of oscillation frequency due to temperature variation. Details of this point will be described later in a subsequent statement.

Now in the following, the constitution of voltage control crystal oscillating circuit 42 of FIG. 1 is described with reference to FIG. 4.

In the voltage control crystal oscillating circuit 42, a stabilized DC voltage is supplied from the power source regulator 29 of FIG. 1 to amplifying circuits 46, 47.

An oscillating circuit is constituted with amplifying circuit 46 and resistor 48 connected in parallel, and a crystal oscillator 24 is oscillated by the oscillating circuit.

The oscillation output is supplied via amplifying circuit 47 and Vout terminal 43 to VCO/synthesizer 19 of FIG. 2.

Figure 4:
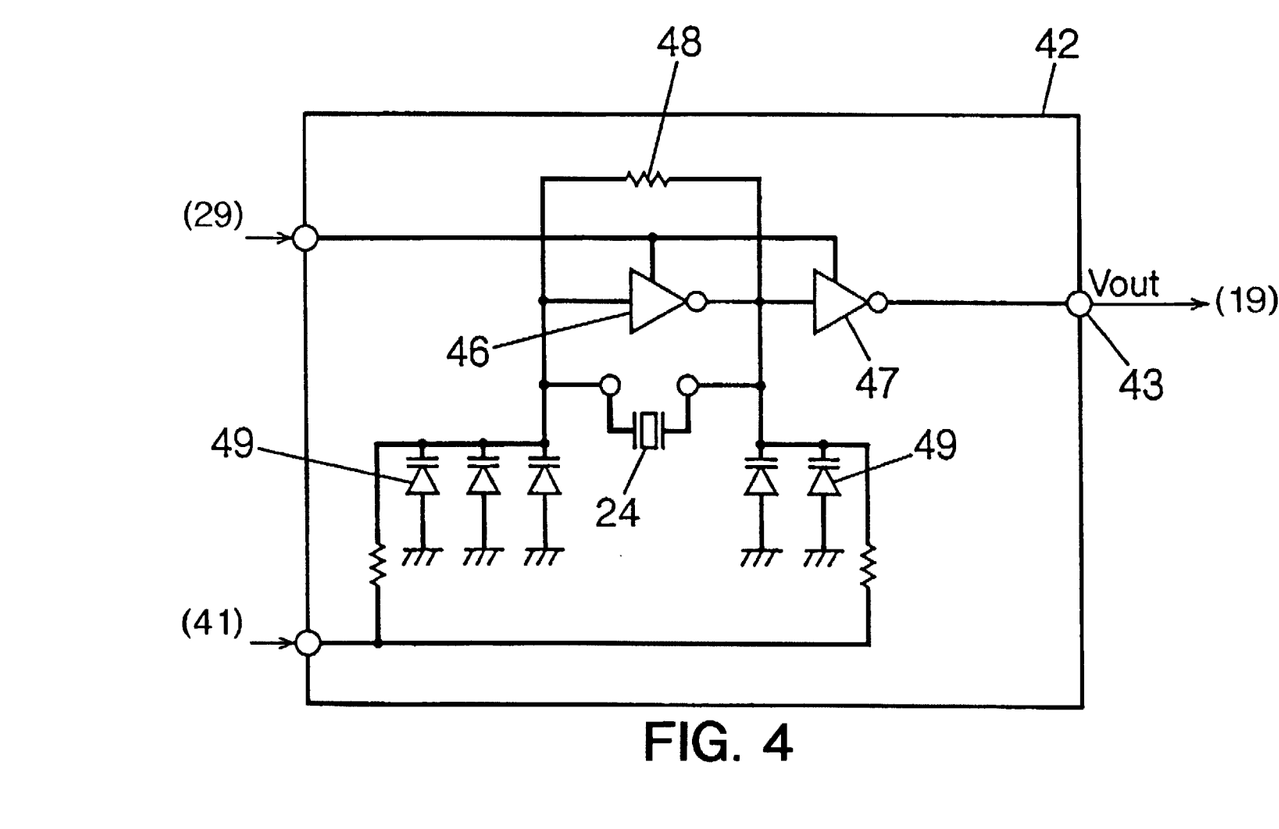
FIG. 4 is a block diagram of a voltage control crystal oscillating circuit used in the crystal oscillation apparatus of FIG. 1.

In FIG. 4, a plurality of varactor diodes 49 provided as frequency adjusting element to both input and output sides of the crystal oscillator 24 adjust the oscillation frequency. The capacitance of these varactor diodes 49 is adjusted in accordance with the level of DC voltage applied to the cathode of varactor diodes 49 via sample hold circuit 41 of FIG. 1. Thereby the oscillation frequency is adjusted.

In the present embodiment, the overall capacitance of plural varactor diodes 49 disposed at the input side of crystal oscillator 24 is made to be equal to or larger than the overall capacitance of plural varactor diodes 49 disposed at the output side. The reason is for reducing the power consumption; if the capacitance at output side is larger, a larger current readily flows resulting in a large power consumption.

Figure 5:
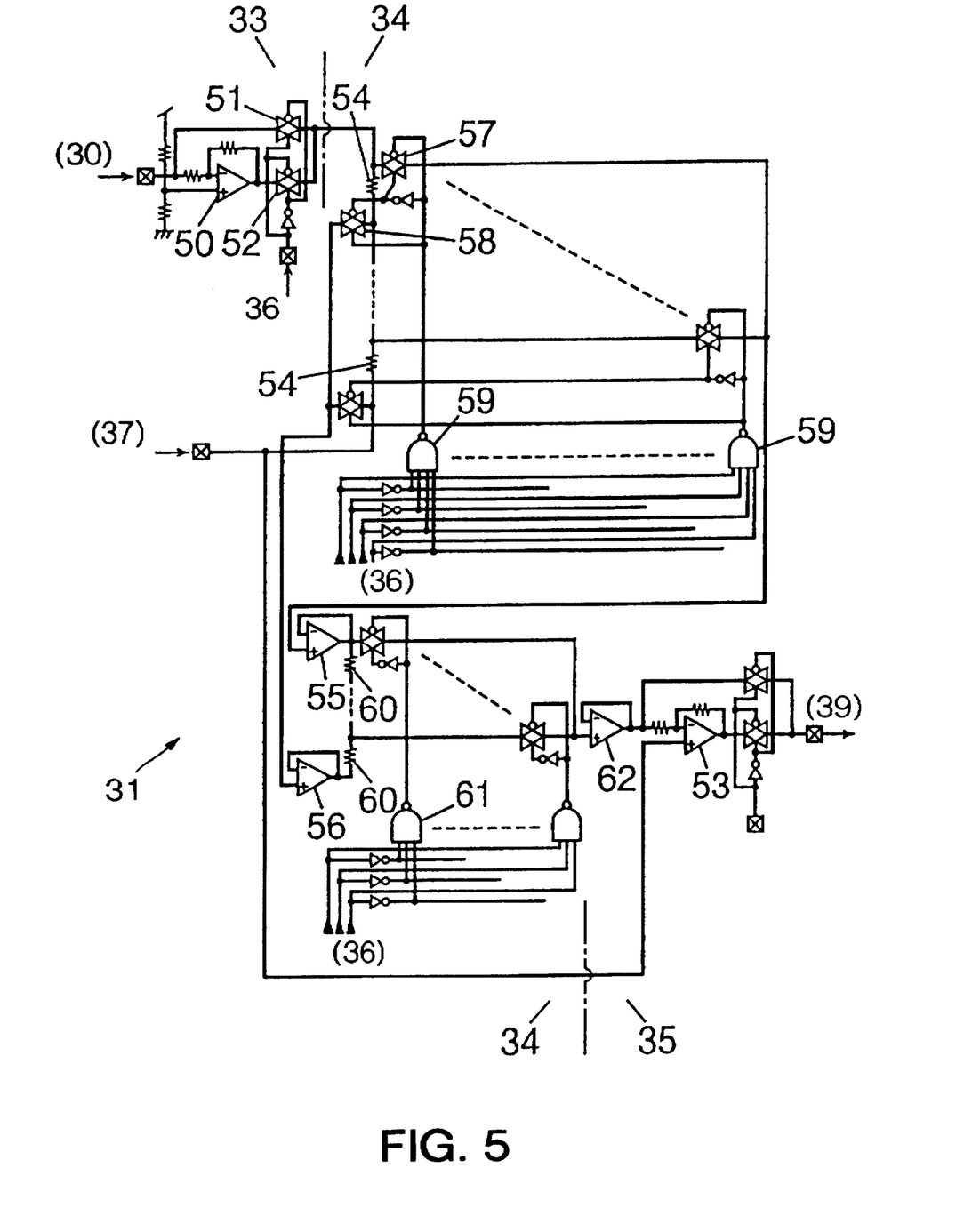
FIG. 5 is a circuit diagram of an amplifier used in the crystal oscillation apparatus of FIG. 1.

Next, the amplifier 31 is described. The amplifier 31 is comprised of polarity reversing circuit 33, variable attenuator 34, and amplifying circuit 35, connected in series, details of which are shown in FIG. 5.

The polarity reversing circuit 33 is comprised of an amplifying circuit 50 and two switching devices 51, 52. Each of the switching devices 51, 52 makes opposite switching action to each other, the amplification ratio of amplifying circuit 50 is 1, and the output of temperature sensor 30 is delivered to the reversal input terminal of the amplifying circuit 50.

The ON and OFF operation of said switching devices 51, 52 is determined by digital data supplied from memory 36.

Namely, in a case when the switching device 51 is held to be ON while the switching device 52 is OFF by a digital data supplied from said memory 36, an output from temperature sensor 30 bypasses the amplifying circuit 50 to be delivered as it is to variable attenuator 34 via switching device 51.

Contrary to the above, when the switching device 51 is OFF while 52 is ON, the output from temperature sensor 30 is reversed at amplifying circuit 50 to be delivered to variable attenuator 34.

The variable attenuator 34 thus receiving the output from polarity reversing circuit 33 is for controlling the graduation by producing a preliminary graduation taking into account the eventual graduation to be obtained after amplification by the amplifying circuit 35.

The variable attenuator 34 comprises 16 resistors 54 connected in series, and a plurality of switching devices 57, 58, two respective pieces of which form one switch set, for guiding the voltage between the ends of a selected resistor 54 to amplifying circuits 55, 56; wherein the selected switching devices 57, 58 are held ON at a same time.

A couple of switching devices 57, 58 is determined depending on which NAND element 59, among several such elements, was selected by a digital data supplied from memory 36.

As a result of the ON operation of selected switching devices 57, 58, the voltage between both ends of a selected resistor 54 is supplied in one end to amplifying circuit 55, and the other end to amplifying circuit 56.

Between the outputs of amplifying circuits 55, 56, sixteen resistors 60 are connected in series. As to which top end of resistors 60 is selected depends on which NAND element 61, among several such elements, was selected by a digital data supplied from memory 36. The top end voltage of selected resistor 60 is supplied to an amplifying circuit 62.

Namely, a primary selection of voltage, e.g. 8/16 V and 7/16 V, is performed at the upper part of variable attenuator 34 shown in FIG. 5, and then at the lower part of FIG.5 a secondary voltage selection, viz which voltage value between 8/16 V and 7/16 V is to be selected, is performed by the selection of a resistor 60 among the 16 resistors.

If for example a 7.5/16 V is selected, this is supplied to an amplifying circuit 53 via amplifying circuit 62.

As the amplification ratio of amplifying circuit 53 is fixed at e.g. 20 times, said output from amplifying circuit 62 inputted at the reversal input terminal is delivered as the output of −20 times. Thus, the graduation, polarity of which is fixed at said polarity reversing circuit 33, is set in this amplifying circuit 53.

To the non-reversal input terminal of amplifying circuit 53, an analogue voltage is supplied from second D/A converter 37; the analogue voltage makes itself the offset voltage.

Figure 6:
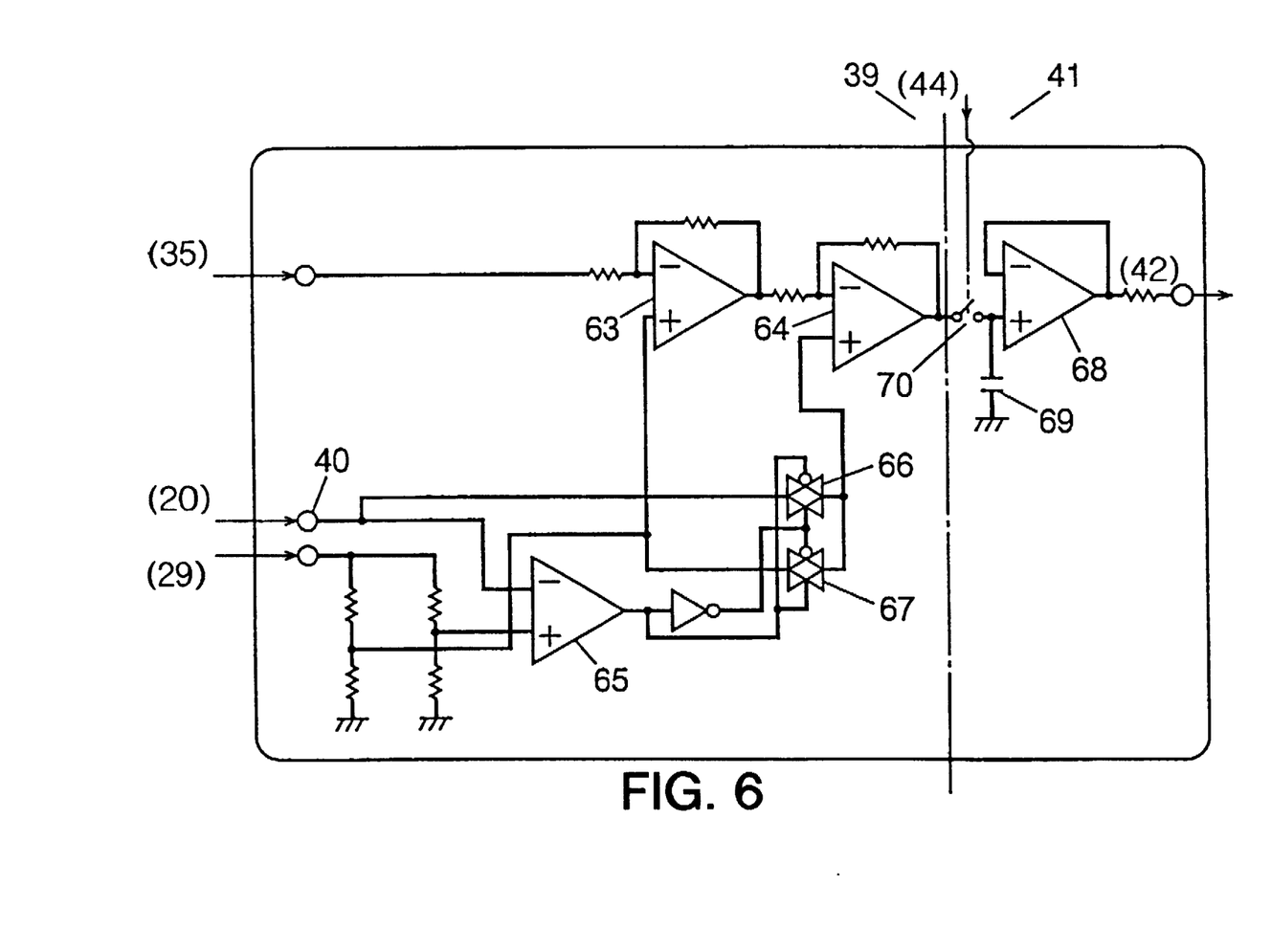
FIG. 6 is a circuit diagram of an adder and a sample hold circuit used in the crystal oscillation apparatus of FIG. 1.

The voltage whose polarity, graduation and offset are thus controlled at amplifier 31 is delivered to an adder 39. The constitution of adder 39 is as shown in FIG. 6.

The output from amplifier 31 of FIG. 5 is supplied to the reversal input terminal of amplifying circuits 63, 64, having a−1 amplification; in a case when the oscillation frequency is shifted due to aging or other factors, a DC voltage is supplied to Vc terminal 40 from control circuit 20 of a mobile telephone of FIG. 2.

When said oscillation frequency is shifted to lower side, a DC voltage higher than a specified value is supplied to Vc terminal 40, whereas a lower DC voltage is supplied when the frequency is shifted to higher side.

A comparator 65 watches whether or not a DC voltage lower or higher than a specified value is delivered from the control circuit 20; when such voltage is supplied to the reversal input terminal, an OFF state is produced. Then a switching device 66 is turned ON, and 67 OFF. As a result, said DC voltage that is lower or higher than a specified value is supplied to the non-reversal input terminal of amplifying circuit 64; in a case when said lower voltage is supplied to the terminal, the voltage to be supplied to cathode of varactor diode 49 of FIG. 4 drops and the capacitance increases, and the oscillation frequency is lowered.

Contrary, when a higher DC voltage is supplied to Vc terminal 40, the capacitance of varactor diode 49 decreases with the same reason as described above, and the oscillation frequency is raised. Thus, the adder 39 prevents the shift of oscillation frequency due to aging or other causes.

Next, the output from adder 39 is delivered to a sample hold circuit 41 as shown in FIG. 6.

The sample hold circuit 41 is comprised of an amplifying circuit 68, a capacitor 69 connected to the non-reversal input terminal of the amplifying circuit, a switching device 70 provided at the input side, etc.

Figure 7:
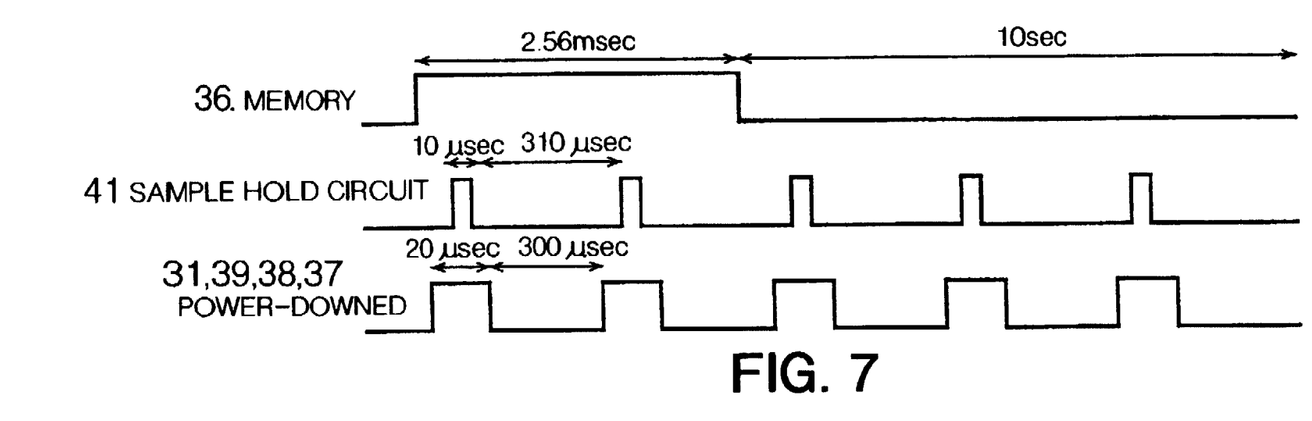
FIG. 7 is a time chart showing the operating condition of key part of the crystal oscillation apparatus of FIG. 1.

The switching device 70 is repeated to open and close intermittently by the power supply control section 44 shown in FIG. 1; close for 10 μsec, open for 310 μsec, as shown in FIG. 7.

While closing, the capacitor 69 is charged up to a DC voltage level set by each of the conditions hitherto established, and the DC voltage value to be supplied to the cathode of varactor diode 49 is determined by the the level of charging.

However, after the switching device 70 is opened the voltage charged in capacitor 69 decreases due to the self discharge. Therefore, the switching device 70 is closed again in 310 μsec for charging.

During the switching device 70 is open, the power supply control section 44 instructs to suspend power supply to all the amplifiers 31, adder 39, and first and second D/A converters 38, 37. This is intended to save the energy.

The suspension of power supply to these parts is taken place every time after the sample hold circuit 41 is opened, as shown in FIG. 7, thereby the capacitor 69 is charged without fail.

The memory 36 repeats predetermined routine execution. Energy consumption is saved by the power supply control section 44 through the intermittent power supply to memory 36.

As 1 cycle time of routine takes 2.56 msec, the 2.56 msec is made as the time for power supply to memory 36, while the suspension time is set to be 10 sec.

Figure 8:
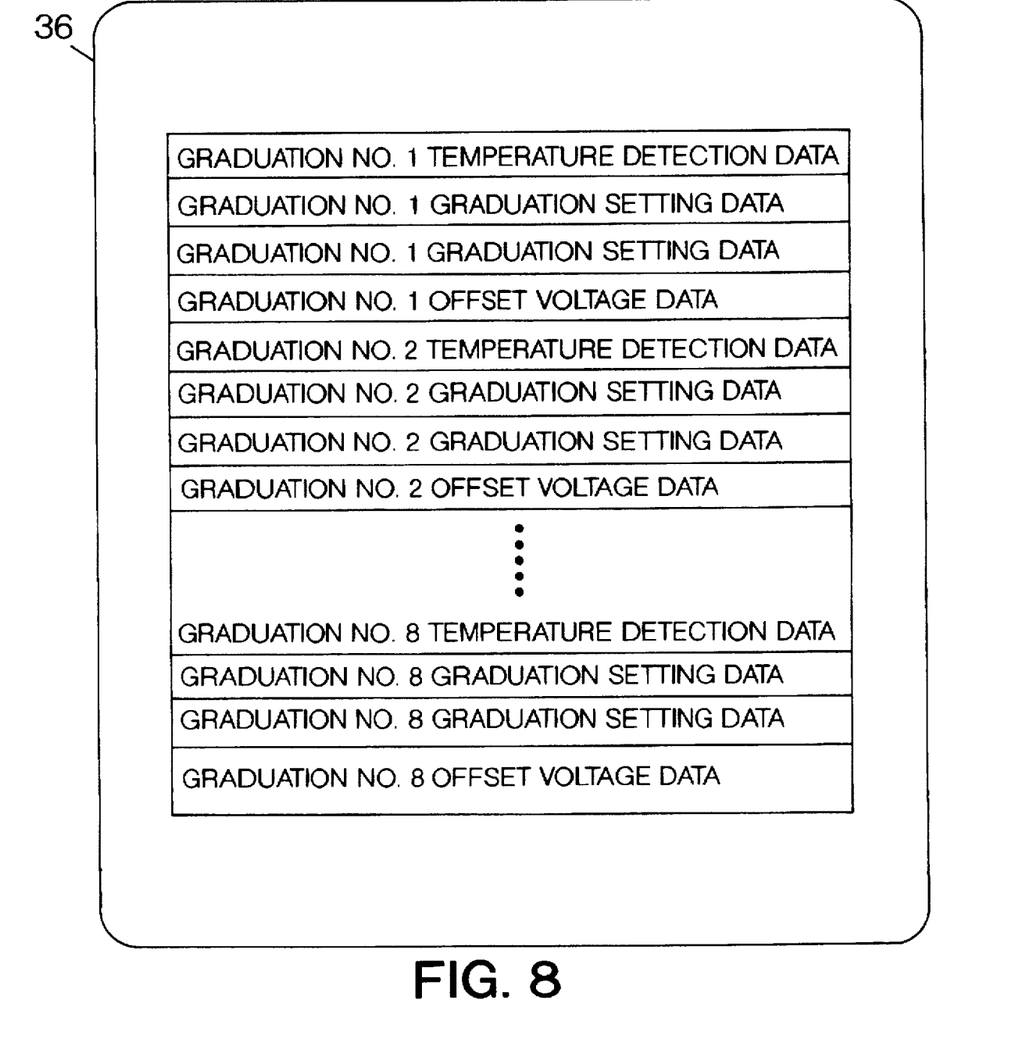
FIG. 8 is a memory map of a memory device used in the crystal oscillation apparatus of FIG. 1.

The memory 36 is comprised of EEPROM, whose data are rewritable.

In practice, there are 8 control voltage setting groups, each group consisting of 4 bytes, in memory 36, as shown in FIG. 8.

In each of the control voltage setting groups, a temperature detection data is memorized in the 1st byte, a graduation setting data in the 2nd byte, a graduation setting data in the 3rd byte, and an offset voltage data in the 4th byte.

The first control voltage setting group represents a first, from low temperature side towards high temperature side, linear control voltage(containing the polarity, graduation and offset voltage), the second control voltage setting group a second towards the high temperature side, the third control voltage setting group a third towards the high temperature side, the fourth control voltage setting group a fourth towards the high temperature side, the fifth control voltage setting group a fifth towards the high temperature side, the sixth control voltage setting group a sixth towards the high temperature side, the seventh control voltage setting group a seventh towards the high temperature side, and the eighth control voltage setting group an eighth towards the high temperature side; in this constitution, however, depending on the characteristics of crystal oscillator 24, the temperature compensation from the low temperature towards high temperature side may be completed without using the entire control voltage setting groups up to the eighth group.

Namely, the greatest feature with the present embodiment is that the temperature compensation covering from the low to high temperature range can be linear-approximated using a number of the linear control voltages, eight at the most.

Now in the present embodiment, a case 26 is attached on a board 23 as shown in FIG. 3 to hermetically seal-in an IC 25 and a crystal oscillator 24, then these members as they are put into a thermostatic chamber to write data in the memory there. When, the switching device 70 of FIG. 6 is kept open.

The temperature of thermostatic chamber is raised from −30° C. gradually to 80° C.; meanwhile, at each 10° C., DC voltage is applied on varactor diode 49 via capacitor 69 and amplifying circuit 68 of FIG. 6.

Figure 9:
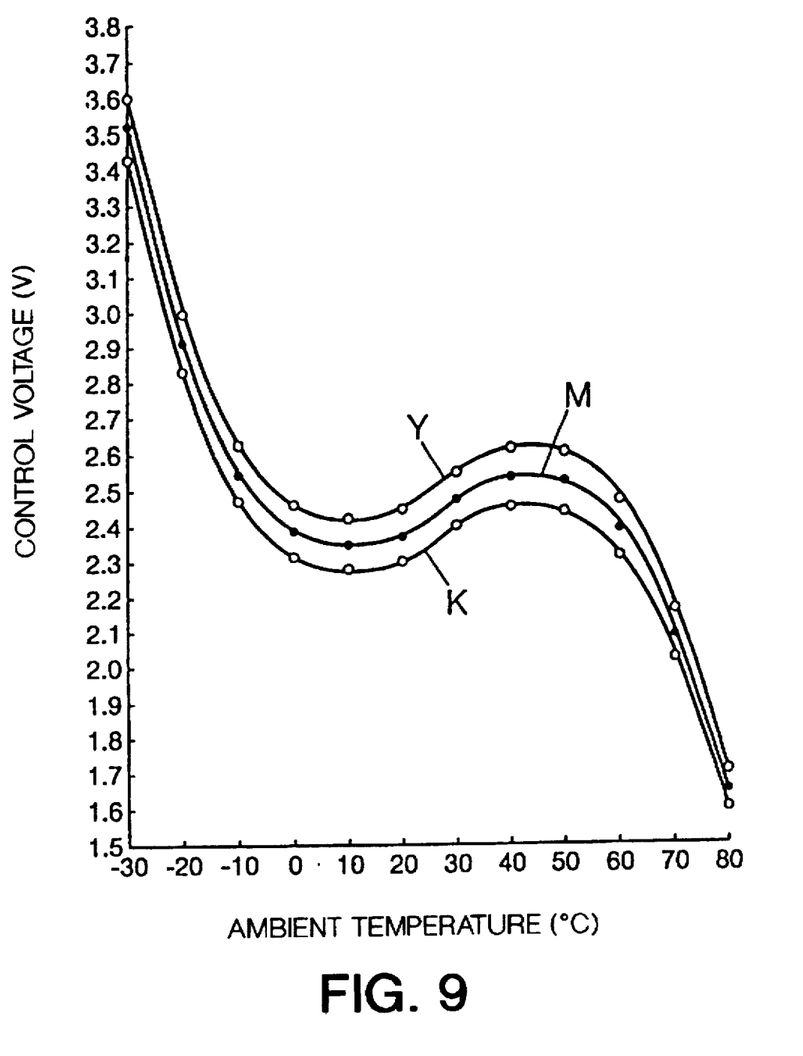
FIG. 9 is a chart showing the control voltage applied to varactor diode of a voltage control crystal oscillating circuit used in the crystal oscillation apparatus of FIG. 1.

In each of the 10° C. zones, the control voltage with which the oscillation frequency of voltage control crystal oscillating circuit 42 is held constant at e.g. 12.8 MHz being the standard frequency, is plotted to obtain a line M of FIG. 9.

Likewise, in each of the 10° C. zones, the control voltage with which the oscillation frequency of voltage control crystal oscillating circuit 42 is held at +1 PPM of the 12.8 MHz is plotted to obtain a line Y of FIG. 9.

Likewise, in each of the 19° C. zones, the control voltage with which the oscillation frequency of voltage control crystal oscillating circuit 42 is held at −1 PPM of the 12.8 MHz is plotted to obtain a line K of FIG. 9

Figure 10:
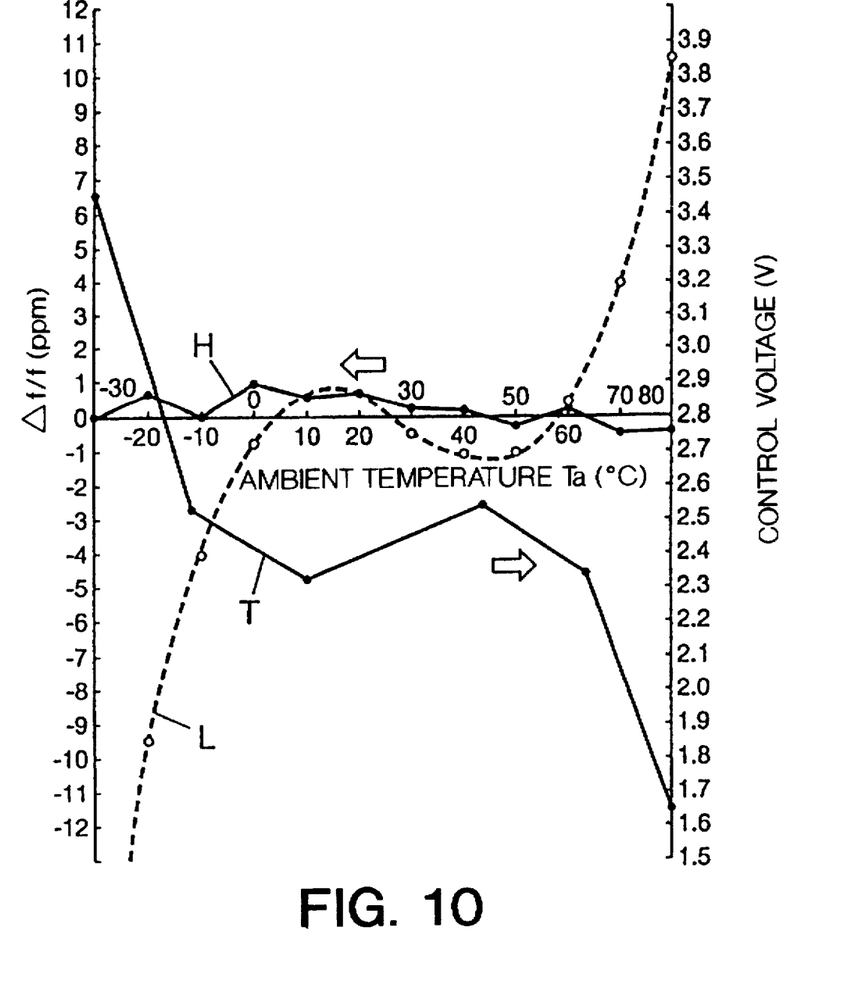
FIG. 10 is a chart showing the voltage applied to varactor diode of a voltage control crystal oscillating circuit, and the oscillation frequency in the crystal oscillation apparatus of FIG. 1.

By connecting from the −30° C. to 80° C. so that it falls within an area between the lines Y and K, 5 linear control voltages (line T) are obtained as shown in FIG. 10.

The first (from the low temperature) straight line of linear control voltage line T covers a region from −30° C. to −12° C., making a straight voltage control line connecting from 3.45 V to 2.54 V.

The second line covers from −12° C. to +9° C., making a straight voltage control line connecting from 2.54 V to 2.33 V.;

The third line covers from 9° C. to 43° C., making a straight voltage control line connecting from 2.33 V to 2.55 V.

The fourth line covers from 43° C. to 63° C., making a straight voltage control line connecting from 2.55 V to 2.35 V.

The fifth line covers from 63° C. to 80° C., making a straight voltage control line connecting from 2.35 V to 1.65 V.

The above described data corresponding to each of the 5 straight voltage control lines are written respectively in the first to fifth control voltage setting groups of memory 36, as the temperature detection data, graduation setting data, and offset voltage data.

When the writing of data into memory 36 is finished the switching device 70 of FIG. 6 is restored to normal state, under which state the open/close operation is controlled by power supply control section 44 as described already.

And then, when the temperature of thermostatic chamber is raised from −30° C. gradually to 80° C., anode of varactor diode 49 receives from time to time according to the temperature the control voltage (line T) of FIG. 10 generated according to data from memory 36. As a result, the oscillation frequency of voltage control crystal oscillating circuit 42 is maintained within ±1 PPM, as shown in FIG. 10 with a line H. Thus, a crystal oscillation apparatus of very high precision is implemented.

A line L in FIG. 10 represents shifting frequency of the oscillation when the above described control voltage was not applied to. When the line H of present embodiment is compared with the line L, it may be understood that the accuracy of invented apparatus is extremely high despite the fact that it is obtained through a linear approximation with 5 straight control voltage lines.

The temperature detection data of each control voltage setting group in memory 36 is converted into DC voltage at the first D/A converter 38 of FIG. 1, and then supplied to temperature detecting section 32 to be compared with the present temperature detected by temperature sensor 30. As the temperature sensor is comprised of semiconductor diode, the output voltage linearly decreases along with the increasing temperature.

When the voltage from first D/A converter 38 is recognized to be higher as a result of the temperature comparison, a next sequence is executed to read out the data of control voltage setting group.

As a result of repetition of the sequence, when the DC voltage from temperature sensor 30 goes higher than that from first D/A converter 38, the graduation setting data and offset voltage data of corresponding control voltage setting group in memory 36 are read out. Among which data, the graduation setting data is supplied to polarity reversing circuit 33 and variable attenuator 34 in amplifier 31 of FIG. 5. The offset voltage data is supplied to variable attenuator 34 and amplifying circuit 35 of FIG. 5 via second D/A converter 37, as described already.

As described above, the present embodiment conducts a straight line approximation with linear control voltages numbering not more than 8. This is based on new findings that among the voltage control crystal oscillating circuits each one circuit has its own shape of control voltage zone (shown in FIG. 9), different to each other, and that despite the above fact the high precision control as accurate as +1 PPM is implementable with linear control voltages counting as many as 8.

The finding made the grouping into 8 units of actually-operative control voltage setting groups of memory 36 possible, which enabled a significant down-sizing of memory device, hence simplification and down-sizing of control circuits, further effects include saving of energy consumption.

INDUSTRIAL APPLICABILITY

The invented apparatus comprises a crystal oscillating circuit, a frequency adjusting element electrically coupled with the crystal oscillating circuit, and a control circuit for controlling the voltage to be applied to the frequency adjusting element; said control circuit comprises a temperature sensor, a temperature detecting section electrically coupled with the temperature sensor, a memory device electrically coupled with the temperature detecting section, an amplifier to which the memory device and said temperature sensor are electrically coupled, a first D/A converter electrically intervening between said memory device and temperature detecting section, a second D/A converter electrically intervening between said memory device and amplifier; said memory device comprises actually-operative control voltage setting groups counting not more than 8 units, each of the control voltage setting groups has in the memory a temperature detection data, amplitude setting data, and an offset voltage data.

Under the above described constitution, the memory contains not more than actually-operative 8 control voltage setting groups, each of which groups is comprised of temperature detection data, amplitude setting data and offset voltage data. Therefore, a memory device of smaller memory capacity is suffice, and a simpler control circuit can control memories of not more than 8 actually-operative control voltage setting groups, as a result the size of semiconductor integrated circuits containing the memory and control circuit can be made smaller.

Furthermore, the smaller memory and the simpler control circuit can work on a smaller power consumption.

| EXPLANATION OF THE NOTATIONS |
| --- |
| 1 Antenna |
| 2 Receiver |
| 3 Antenna commoner |
| 4 Amplifier |
| 5 Band pass filter |
| 6 Mixer |
| 7 Band pass filter |
| 8 Mixer |
| 9 Band pass filter |
| 10 Demodulator |
| 11 Receiving signal processing circuit |
| 12 Transmitter |
| 13 Transmitting signal processing circuit |
| 14 Modulator |
| 15 Band pass filter |
| 16 Power amplifying section |
| 17 Isolator |
| 18 Band pass filter |
| 19 VCO/synthesizer |
| 20 Control circuit |
| 21 TCXO (temperature compensation type crystal oscillating circuit) |
| 22 Key Display panel |
| 23 Board |
| 24 Crystal oscillator |
| 25 IC (semiconductor integrated circuits) |
| 26 Case |
| 27 Vcc terminal |
| 28 Battery |
| 29 Power source regulator |
| 30 Temperature sensor |
| 31 Amplifier |
| 32 Temperature detecting section |
| 33 Polarity reversing circuit |
| 34 Variable attenuator |
| 35 Amplifying circuit |
| 36 Memory device |
| 37 Second D/A converter |
| 38 First D/A converter |
| 39 Adder |
| 40 Vc terminal |
| 41 Sample hold circuit |
| 42 Voltage control crystal oscillating circuit |
| 43 Vout terminal |
| 44 Power supply control section |
| 45 Grounding terminal |
| 46 Amplifying circuit |
| 47 Amplifying circuit |
| 48 Resistor |
| 49 Varactor diode |
| 50 Amplifying circuit |
| 51 Switching device |
| 52 Switching device |
| 53 Amplifying circuit |
| 54 Resistor |
| 55 Amplifying circuit |
| 56 Amplifying circuit |
| 57 Switching device |
| 58 Switching device |
| 59 NAND element |
| 60 Resistor |
| 61 NAND element |

| EXPLANATION OF THE NOTATIONS |
| --- |
| 62 Amplifying circuit |
| 63 Amplifying circuit |
| 64 Amplifying circuit |
| 65 Comparator |
| 66 Switching device |
| 67 Switching device |
| 68 Amplifying circuit |
| 69 Capacitor |
| 70 Switching device |

We claim:

1. A crystal oscillation apparatus comprising:

a crystal oscillating circuit, a frequency adjusting element electrically coupled with the crystal oscillating circuit, and a control circuit for controlling the frequency adjusting element based on a temperature of the crystal oscillating circuit, wherein said control circuit comprises:

(1) a temperature sensor;

(2) a memory device having up to 8 control voltage setting groups, wherein each of the control voltage setting groups stores temperature detection data, amplitude setting data and offset voltage data;

(3) a first digital-analog converter for converting the output signal of said memory device;

(4) temperature detection means for comparing the output signal of said first digital-analog converter with up to 8 control voltage setting groups stored in said memory device, selecting and outputting one of control voltage setting groups corresponding to the output of said temperature sensor;

(5) a second digital-analog converter for converting and outputting the data stored in the control voltage setting group selected at said temperature detecting section; and (6) an amplifier for receiving the data output from said temperature detecting section and said second digital-analog converter and for compensating the output of said temperature sensor.

2. The crystal oscillation apparatus of claim 1, wherein the frequency adjusting element is comprised of a plurality of varactor diodes electrically coupled with at least one of an input side and an output side of the crystal oscillating circuit.

3. The oscillation apparatus of claim 2, wherein a first capacitance of an input side varactor diode is equal to or higher than a second capacitance of an output side varactor diode.

4. The crystal oscillation apparatus of claim 2, wherein the number of varactor diodes electrically coupled with the input side and the output side of the crystal oscillating circuit is selected according to an oscillation frequency of the crystal oscillating circuit.

5. A crystal oscillation apparatus comprising:

crystal oscillating circuit, a frequency adjusting element electrically coupled with the crystal oscillating circuit, and a control circuit for controlling the frequency adjusting element based on a temperature of the crystal oscillating circuit, wherein said control circuit comprises:

(1) a temperature sensor;

(2) a memory device having up to 8 control voltage setting groups, wherein each of the control voltage setting groups stores temperature detection data, amplitude setting data and offset voltage data;

(3) a first digital-analog converter for converting the output signal of said memory device;

(4) temperature detection means for comparing the output signal of said first digital-analog converter with up to 8 control voltage setting groups stored in said memory device, selecting and outputting one of control voltage setting groups corresponding to the output of said temperature sensor;

(5) a second digital-analog converter for converting and outputting the data stored in the control voltage setting group selected at said temperature detecting section;

(6) an amplifier for receiving the data output from said temperature detecting section and said second digital-analog converter and for compensating the output of said temperature sensor; and wherein at least one of i) the amplifier, ii) the first D/A converter, iii) the second D/A converter, iv) the temperature detecting section and v) the memory device performs an intermittent operation.

6. The crystal oscillation apparatus of claim 5, wherein a time between the intermittent operation and a subsequent intermittent operation in at least one of i) the amplifier, ii) the first D/A converter, iii) the second D/A converter and iv) the temperature detecting section is a first time, said first time being shorter than a second time between the intermittent operation and the subsequent operation in the memory device.

7. The crystal oscillation apparatus of claim 5, wherein the first D/A converter and the second D/A converter are each comprised of a variable attenuator.

8. The crystal oscillation apparatus of claim 7, wherein an output from the variable attenuator is set at a voltage not lower than 0 volts.

9. A crystal oscillation apparatus comprising:

a crystal oscillating circuit, a frequency adjusting element electrically coupled with the crystal oscillating circuit, and a control circuit for controlling the frequency adjusting element based on a temperature of the crystal oscillating circuit, wherein said control circuit comprises:

(1) a temperature sensor;

(2) a memory device having up to 8 control voltage setting groups, wherein each of the control voltage setting groups stores temperature detection data, amplitude setting data and offset voltage data;

(3) a first digital-analog converter for converting the output signal of said memory device;

(4) temperature detection means for comparing the output signal of said first digital-analog converter with up to 8 control voltage setting groups stored in said memory device, selecting and outputting one of control voltage setting groups corresponding to the output of said temperature sensor;

(5) a second digital-analog converter for converting and outputting the data stored in the control voltage setting group selected at said temperature detecting section;

(6) an amplifier for receiving the data output from said temperature detecting section and said second digital-analog converter and for compensating the output of said temperature sensor; and wherein the frequency adjusting element and the control circuit are contained within a single semiconductor device.

10. A crystal oscillation apparatus comprising:

a crystal oscillating circuit, a frequency adjusting element electrically coupled with the crystal oscillating circuit, and a control circuit for controlling a voltage to be applied to the frequency adjusting element, having a temperature sensor for sensing a temperature of the crystal oscillating circuit, a temperature detecting section electrically coupled with the temperature sensor, a memory device electrically coupled with the temperature detecting section, said memory device having up to 8 control voltage setting groups to control the frequency adjusting element, each of the control voltage setting groups has i) temperature detection data, ii) amplitude setting data, and iii) offset voltage data, an amplifier to which the memory device and said temperature sensor are electrically coupled, a first digital-analogue (D/A) converter coupled between said memory device and said temperature detecting section, a second D/A converter coupled between said memory device and said amplifier; and a sample and hold circuit coupled between said frequency adjusting element and said amplifier.

11. The crystal oscillation apparatus of claim 10, wherein at least one of i) the amplifier, ii) the first D/A converter, iii) the second D/A converters, iv) the temperature detecting section and, v, the memory device performs an intermittent operation.

12. The crystal oscillation apparatus of claim 11, wherein a time between the intermittent operation and subsequent intermittent operation in at least one of i) the amplifier, ii) the first D/A converter, iii) the second D/A converter and iv) the temperature detecting section is a first time, said first time being shorter than a second time between the intermittent operation and the subsequent operation in the memory device.

13. A method of adjusting a crystal oscillation apparatus which is comprised of a crystal oscillating circuit, a frequency adjusting element electrically coupled with the crystal oscillating circuit, and a control circuit for controlling voltage to be applied to the frequency adjusting element, wherein said control circuit comprises a temperature sensor, a memory device, an amplifier coupled to the memory device and said temperature sensor, said memory device having a plurality of control voltage setting groups, comprising the steps of:

(1) placing the crystal oscillation apparatus into a thermostatic chamber with a circuit between said amplifier and said frequency adjusting element in an open condition, (2) varying a temperature of the thermostatic chamber from a low temperature to a high temperature, (3) finding an upper limit and a lower limit of a band of control voltages, respectively, by which an oscillation frequency of the crystal oscillating circuit is within a specified tolerance range by applying a control voltage to said frequency adjusting element at each of a specified plurality of temperature zones, and (4) plotting up to 8 straight lines from said low temperature through said high temperature to fall within said band of control voltages covering said low temperature to said high temperature determined in step (2), and writing the data produced by a) each of the up to 8 straight lines and b) outputs of the temperature sensor responsive to said low temperature through said high temperature into the memory device as i) temperature detection data, ii) amplitude setting data and iii) offset voltage data corresponding to the respective straight lines.

14. A method of adjusting a crystal oscillation apparatus which is comprised of a crystal oscillating circuit, a frequency adjusting element electrically coupled with the crystal oscillating circuit, and a control circuit for controlling a voltage to be applied to the frequency adjusting element, wherein said control circuit comprises a temperature sensor, a memory device and an amplifier to which the memory device and said temperature sensor are electrically coupled, said memory device having up to 8 control voltage setting groups, comprising the steps of:

(1) placing the crystal oscillation apparatus into a thermostatic chamber with a circuit between said amplifier and frequency adjusting element in an open condition, (2) varying a temperature of the thermostatic chamber from a low temperature to a high temperature (3) finding an upper limit and a lower limit of a band of control voltages, respectively, with which an oscillation frequency of the crystal oscillating circuit is within a specified tolerance range by applying a control voltage to said frequency adjusting element at each of a specified plurality of temperature zones, and (4) plotting up to 8 straight lines from said low temperature through said high temperature to fall within said band of control voltages covering said low temperature to said high temperature determined in step (2), and writing the data produced by a) each of the up to 8 straight lines and b) outputs of the temperature sensor responsive to said low temperature through said high temperature into the memory device as i) temperature detection data, ii) amplitude setting data and iii) offset voltage data corresponding to the respective straight lines.

15. The method of adjusting a crystal oscillation apparatus as claimed in claim 14, wherein a switch is provided between the amplifier and the frequency adjusting element, and an external voltage input terminal is electrically coupled between the switch and the frequency adjusting element.

16. A crystal oscillation apparatus comprising:

a crystal oscillating circuit, a frequency adjusting element electrically coupled with the crystal oscillating circuit, and a control circuit for controlling the frequency adjusting element based on a temperature of the crystal oscillating circuit, wherein said control circuit comprises:

(1) a temperature sensor;

(2) a memory device having up to 8 control voltage setting groups, wherein each of the control voltage setting groups stores temperature detection data, amplitude setting data and offset voltage data;

(3) a first digital-analog converter for converting the output signal of said memory device;

(4) temperature detection means for comparing the output signal of said first digital-analog converter with up to 8 control voltage setting groups stored in said memory device, selecting and outputting one of control voltage setting groups corresponding to the output of said temperature sensor;

(5) a second digital-analog converter for converting and outputting the data stored in the control voltage setting group selected at said temperature detecting section;

(6) an amplifier for receiving the data output from said temperature detecting section and said second digital-analog converter and for compensating the output of said temperature sensor; and wherein said control circuit further comprising:

a temperature detecting section coupled with the temperature sensor, a memory device coupled with the temperature detecting section, an amplifier coupled to the memory device and said temperature sensor, a first digital-analog (D/A) converter coupled between said memory device and said temperature detecting section, and a second D/A converter coupled between said memory device and said amplifier.

17. The crystal oscillation apparatus of claim 16, wherein the amplifier is comprised of a variable attenuator and an amplifying circuit.

18. The crystal oscillation apparatus of claim 17, wherein an output from the variable attenuator is set at a voltage not lower than 0 volts.

19. The crystal oscillation apparatus of claim 16, wherein a switch is provided between the amplifier and the frequency adjusting element, and an external voltage input terminal is electrically coupled between the switch and the frequency adjusting element.

20. A crystal oscillation apparatus comprising:

a crystal oscillating circuit, a frequency adjusting element electrically coupled with the crystal oscillating circuit, and a control circuit for controlling the frequency adjusting element based on a temperature of the crystal oscillating circuit, wherein said control circuit comprises:

(1) a temperature sensor;

(2) a memory device having a plurality of control voltage setting groups, wherein each of the control voltage setting groups stores temperature detection data, amplitude setting data and offset voltage data;

(3) temperature detecting means for comparing the output signal of said temperature sensor with a plurality of control voltage setting groups stored in said memory device, selecting and outputting one of control voltage setting groups corresponding to the output of said temperature sensor; and (4) an amplifier for generating a polarity, a gradient and an offset of a compensation straight line to compensate the output signal of said temperature sensor, based on the data stored in the control voltage setting group selected at said temperature detecting section.

* * * * *